United States Patent [19]
Schuppert, Jr. et al.

[11] Patent Number: 5,246,328
[45] Date of Patent: Sep. 21, 1993

[54] APPARATUS FOR FEEDING ARTICLES FROM TUBE MAGAZINES

[75] Inventors: Leo V. Schuppert, Jr., York; Kerry J. Stakem, Hummelstown, both of Pa.

[73] Assignee: The Whitaker Corporation, Wilmington, Del.

[21] Appl. No.: 862,101

[22] Filed: Apr. 2, 1992

Related U.S. Application Data

[62] Division of Ser. No. 651,671, Feb. 6, 1991, Pat. No. 5,165,837.

[51] Int. Cl.5 ............................................. B23Q 7/10
[52] U.S. Cl. .................................. 414/417; 414/797.4
[58] Field of Search ...................... 198/747, 748, 749; 29/741, 709, 33 M, 809; 414/749, 750, 222, 403, 416, 417, 797, 4, 225, 797.9, 18, 226; 221/11, 198, 251

[56] References Cited

U.S. PATENT DOCUMENTS

| | | | |
|---|---|---|---|
| 3,308,977 | 3/1967 | Cochran et al. | 414/417 X |
| 4,717,304 | 1/1988 | Bocchicchio et al. | 414/417 X |
| 4,862,578 | 9/1989 | Holcomb | 414/417 X |

FOREIGN PATENT DOCUMENTS

| | | | |
|---|---|---|---|
| 244713 | 12/1985 | Japan | 414/417 |
| 191321 | 8/1987 | Japan | 414/797.4 |
| 191322 | 8/1987 | Japan | 414/797.4 |
| 6405103 | 11/1965 | Netherlands | 414/417 |

*Primary Examiner*—Frank E. Werner
*Attorney, Agent, or Firm*—Robert J. Kapalka

[57] ABSTRACT

Apparatus for feeding electronic components from a tube magazine to a pick up station comprises first and second column assemblies which support the tube magazines in a horizontal attitude. One tube is supported in a feeding position and the components are fed therefrom by a flexible tape. After the one tube has been emptied, it is dropped onto an endless belt conveyer which carries the empty tube axially from the apparatus. Automatic tube supports are disclosed for supporting an inventory of filled tubes and for delivering a filled tube to the feeding position after an empty tube has been ejected. The apparatus is relatively narrow so that a plurality of identical apparatus can be placed side by side against each other on a production line.

13 Claims, 11 Drawing Sheets

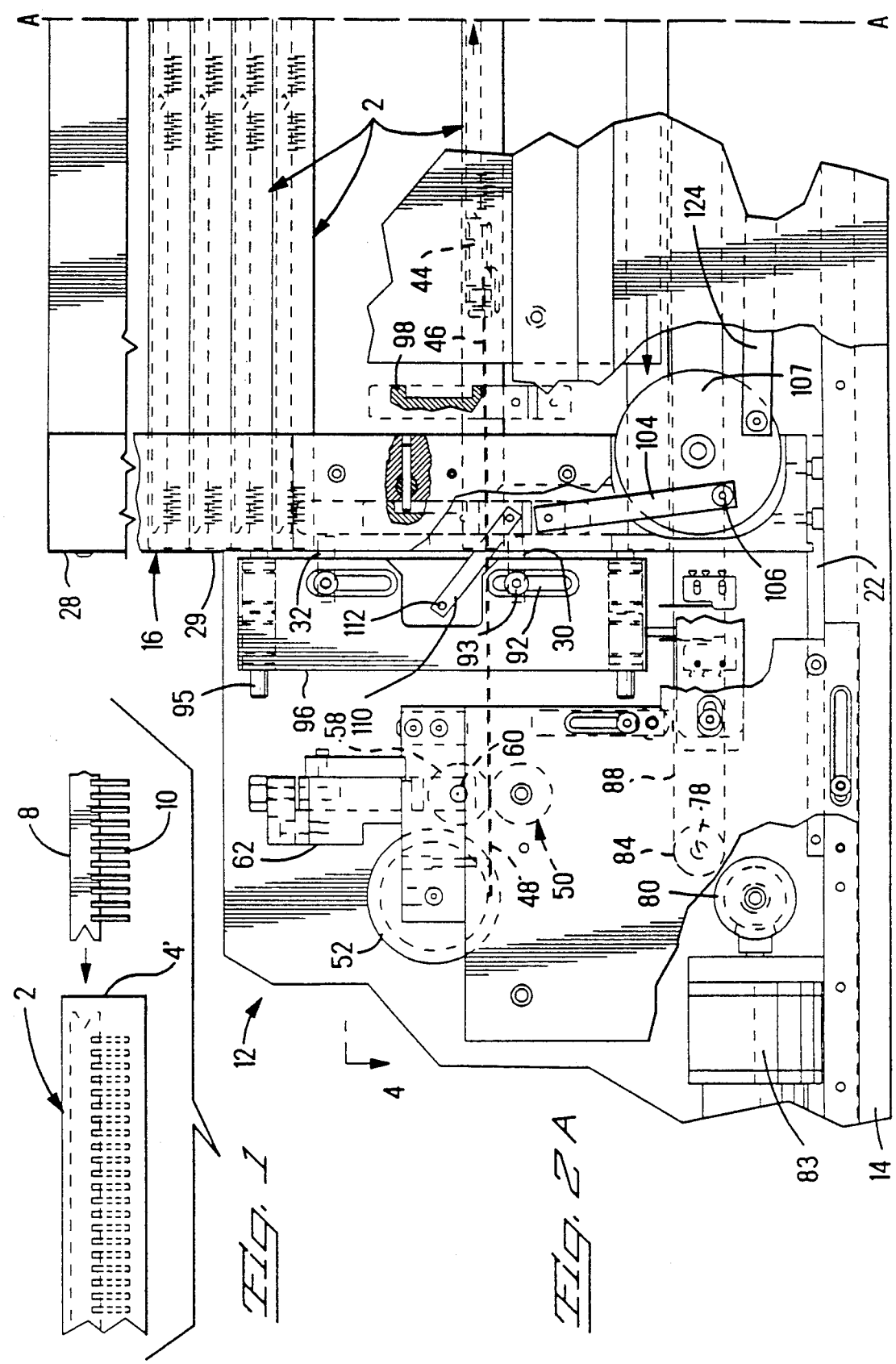

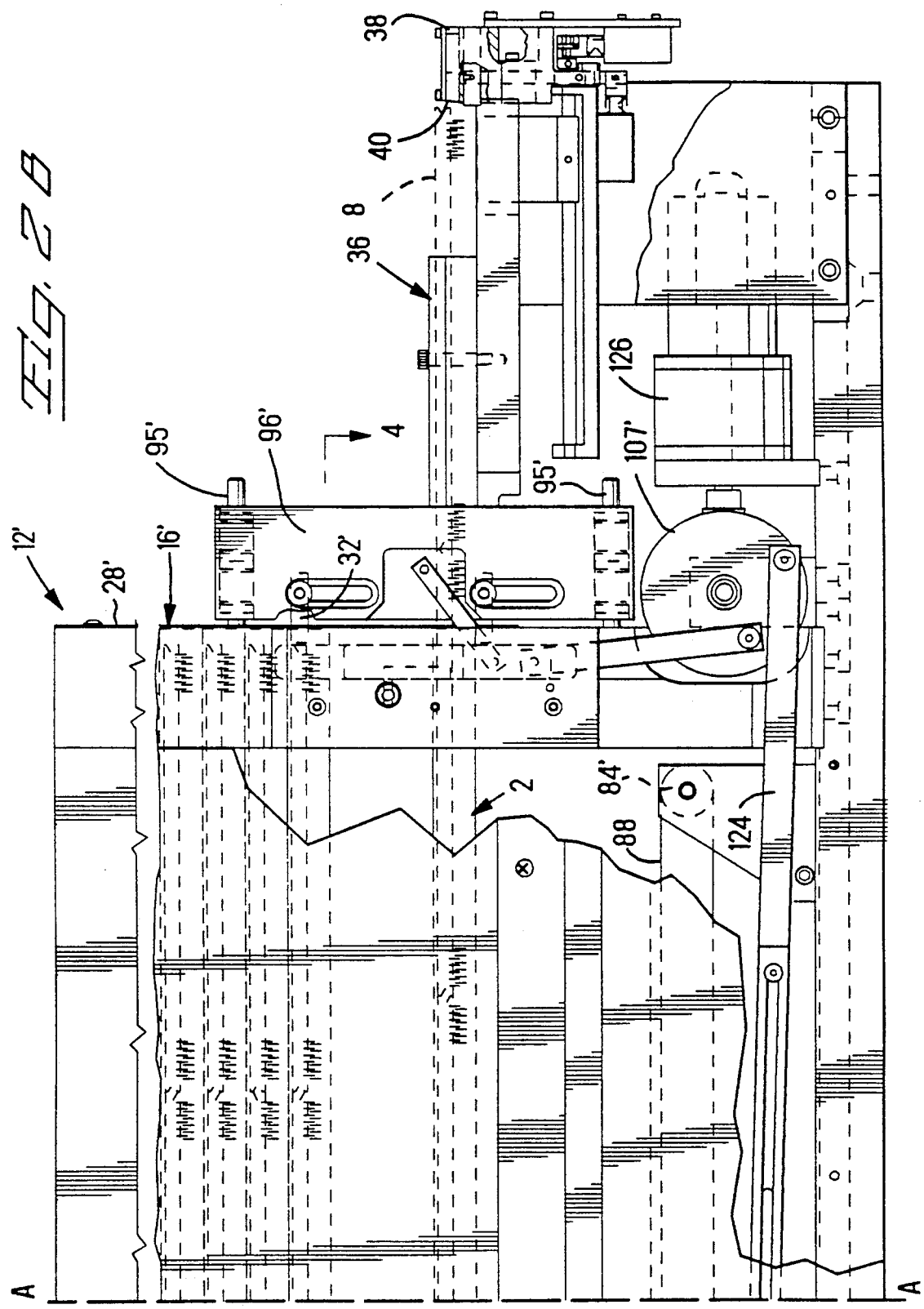

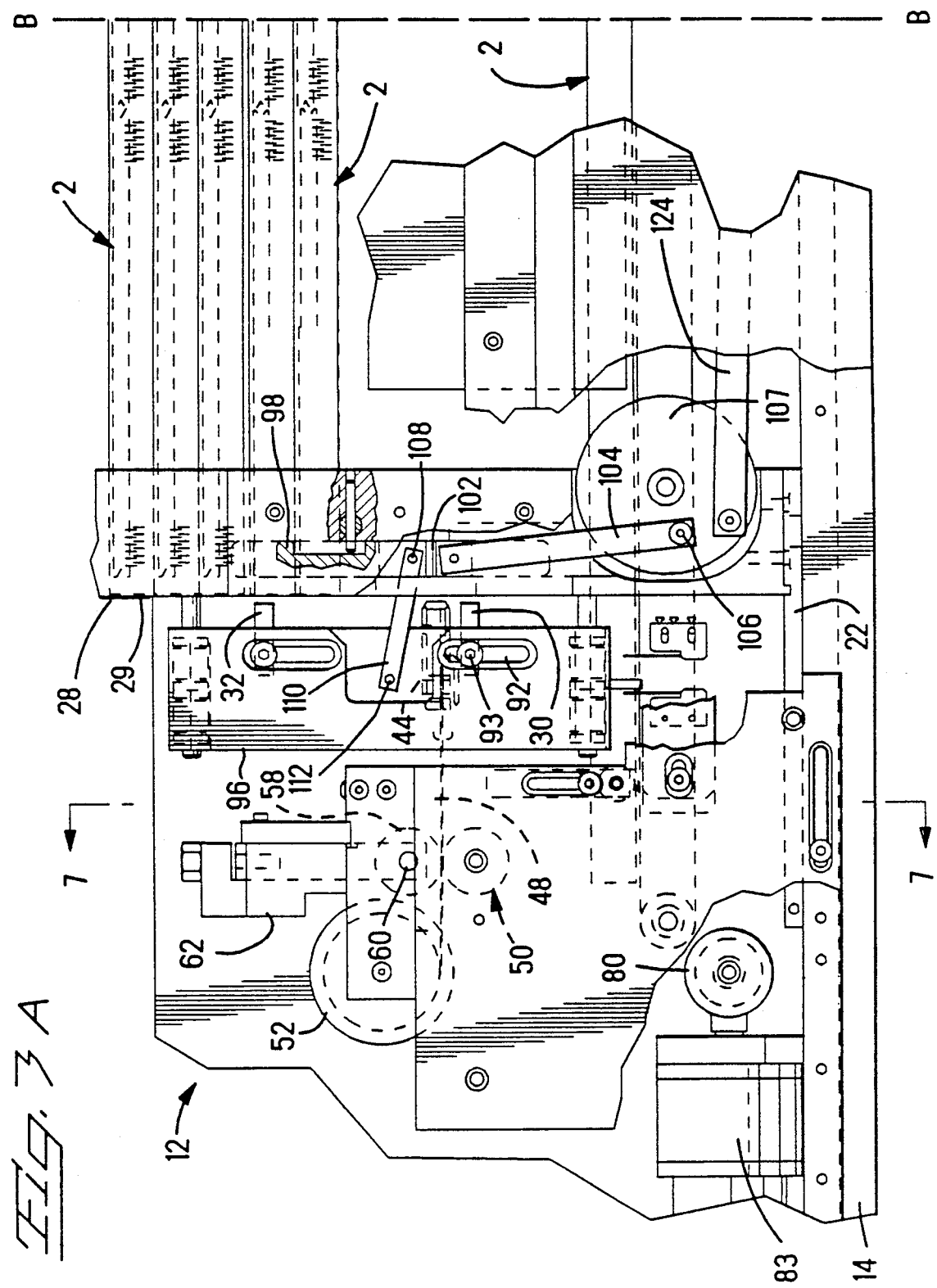

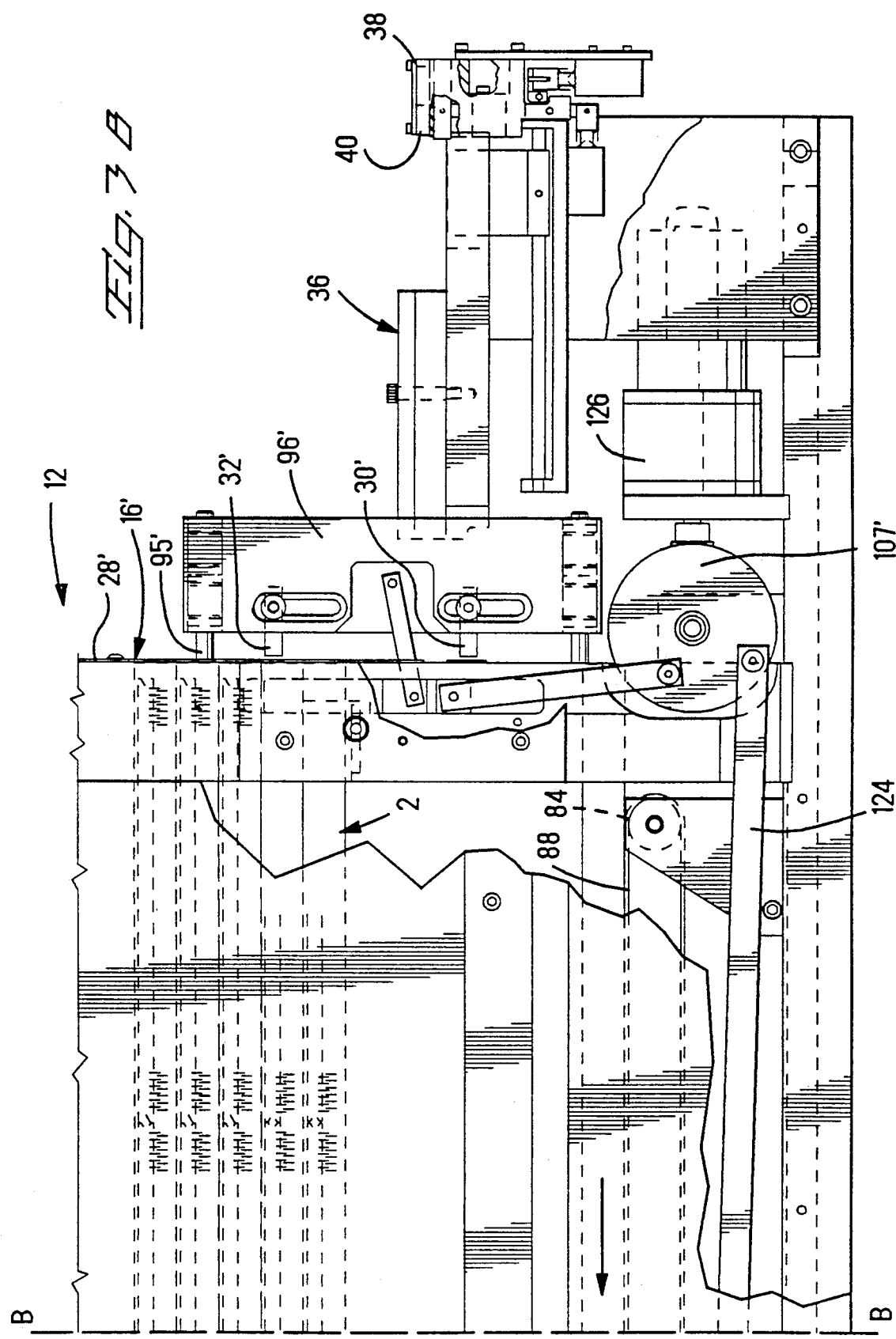

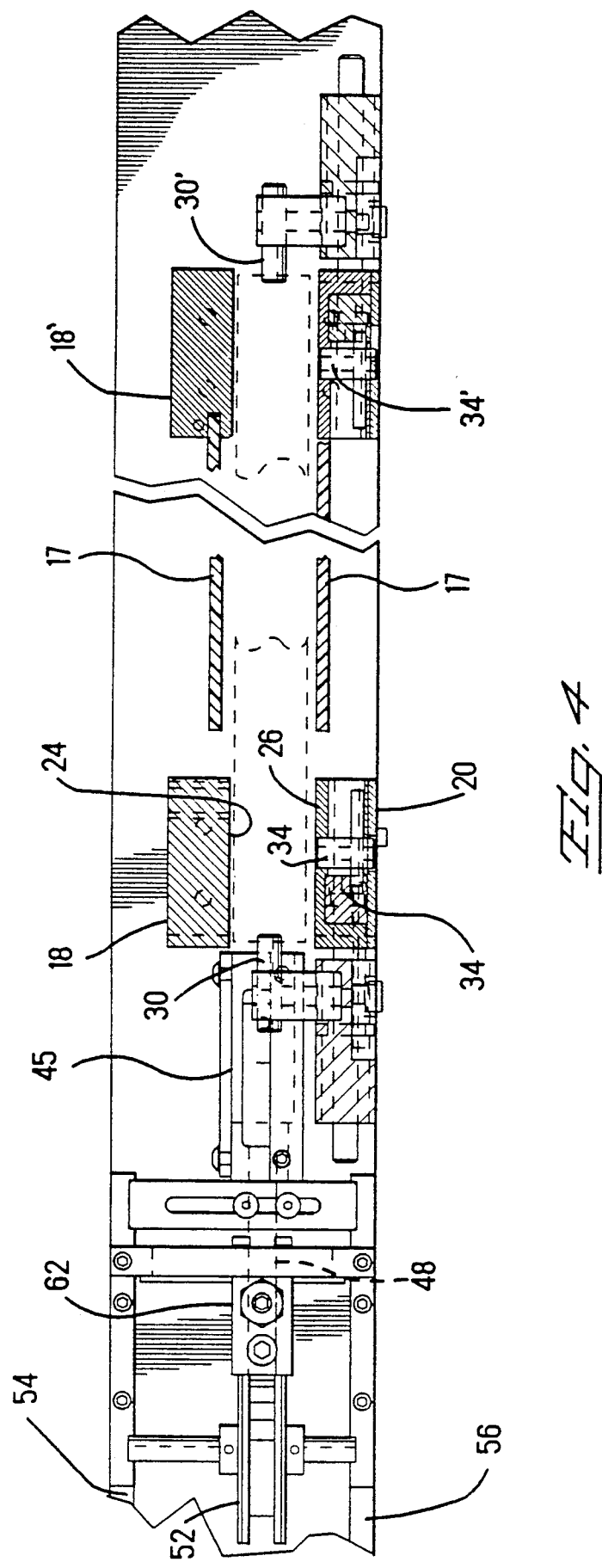

APPARATUS FOR FEEDING ARTICLES FROM TUBE MAGAZINES

This application is a Divisional of application Ser. No. 07/651,671 filed Feb. 6, 1991, now U.S. Pat. No. 5,165,837.

FIELD OF THE INVENTION

This invention relates to feeding apparatus of the type used to feed individual articles, particularly electronic components, from tube magazines to a pickup station at which the individual articles are picked up by a transfer device and placed in an assembly such as a circuit board.

BACKGROUND OF THE INVENTION

It is common practice to package electronic components, such as connectors, integrated circuits, sockets, and the like in extruded tubes which have an interior cross-section that conforms to the shape of the articles or components. The components are simply placed in the interior of the tube, and the ends of the tube are closed during shipment. When the articles, or components, are placed in service, a feeding apparatus is used which automatically feeds the individual articles from one end of the tube to a pickup station of an assembly machine. A robot or similar transfer device picks up the article located at the pickup station and places it on a circuit board or other device which is being assembled.

It is desirable that feeding apparatus of the type described above be capable of operation with a minimum of operator supervision and attention. It is therefore desirable that the apparatus have a system for ejecting an empty tube magazine after all of the components have been fed therefrom and a system for positioning a filled tube magazine in feeding position after an empty tube has been ejected. It is also desirable that the apparatus be designed such that a plurality of identical apparatus can be positioned side by side on closely spaced centerlines. The requirement of close spacing stems from the fact that component feeding devices are commonly used in an automated production line which requires several feeding devices containing different components be located against each other close to the robot which handles the components and places them in an assembly such as a circuit board.

The present invention is directed to the achievement of a component feeder which meets the requirements of having an efficient empty tube ejection system and which is of minimum width so that identical feeders can be placed in side by side relationship in a production line.

THE INVENTION

The invention comprises an apparatus for feeding articles from a tube magazine to a pickup station. The magazine comprises an elongated tube having first and second ends. The articles are stacked against each other in the tube. The apparatus comprises first and second spaced apart column assemblies which have thereon a first tube supporting means for supporting a tube magazine in a horizontal feeding position. Article feeding means are provided for feeding articles from the tube to the pick up station and empty tube ejecting means are provided for removing empty tubes from the apparatus. The apparatus is characterized in that the empty tube ejecting means comprises a conveyer which is beneath the tube support and which is movable in the direction extending from the second column assembly towards, and through, the first column assembly. The first tube support is movable between an extended position and a retracted position and functions to support a tube in feeding position when in its extended position. The control means is programmed to move the first tube support from its extended position to its retracted position after all of the articles in a supported tube have been fed therefrom. In use, after all of the articles in a tube have been fed therefrom, the support is moved to its retracted position and the empty tube falls onto the conveyor. The tube is moved axially by the conveyer through the first column assembly to a discharge zone.

THE DRAWING FIGURES

FIG. 1 shows a tube magazine and an electronic component exploded from, and in alignment with, the tube magazine.

FIG. 2A is a side view of the left side portion of an apparatus for the practice of the invention and FIG. 2B shows the right-hand side. These views show the positions of the parts when a tube magazine is in feeding position FIGS. 3A and 3B are views similar to FIGS. 2A and 2B showing the positions of the parts during ejection of an empty tube and placement of a filled tube in feeding position.

FIG. 4 is a fragmentary sectional view taken along the lines 4—4 of FIGS. 2A and 2B.

Figure 12:
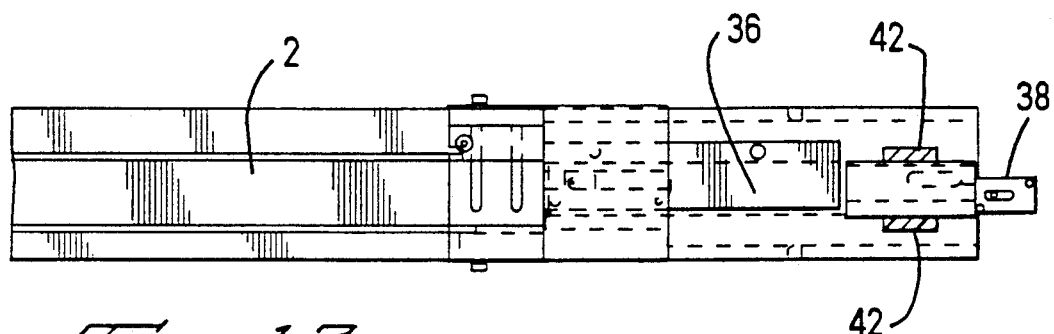
Figure 10:
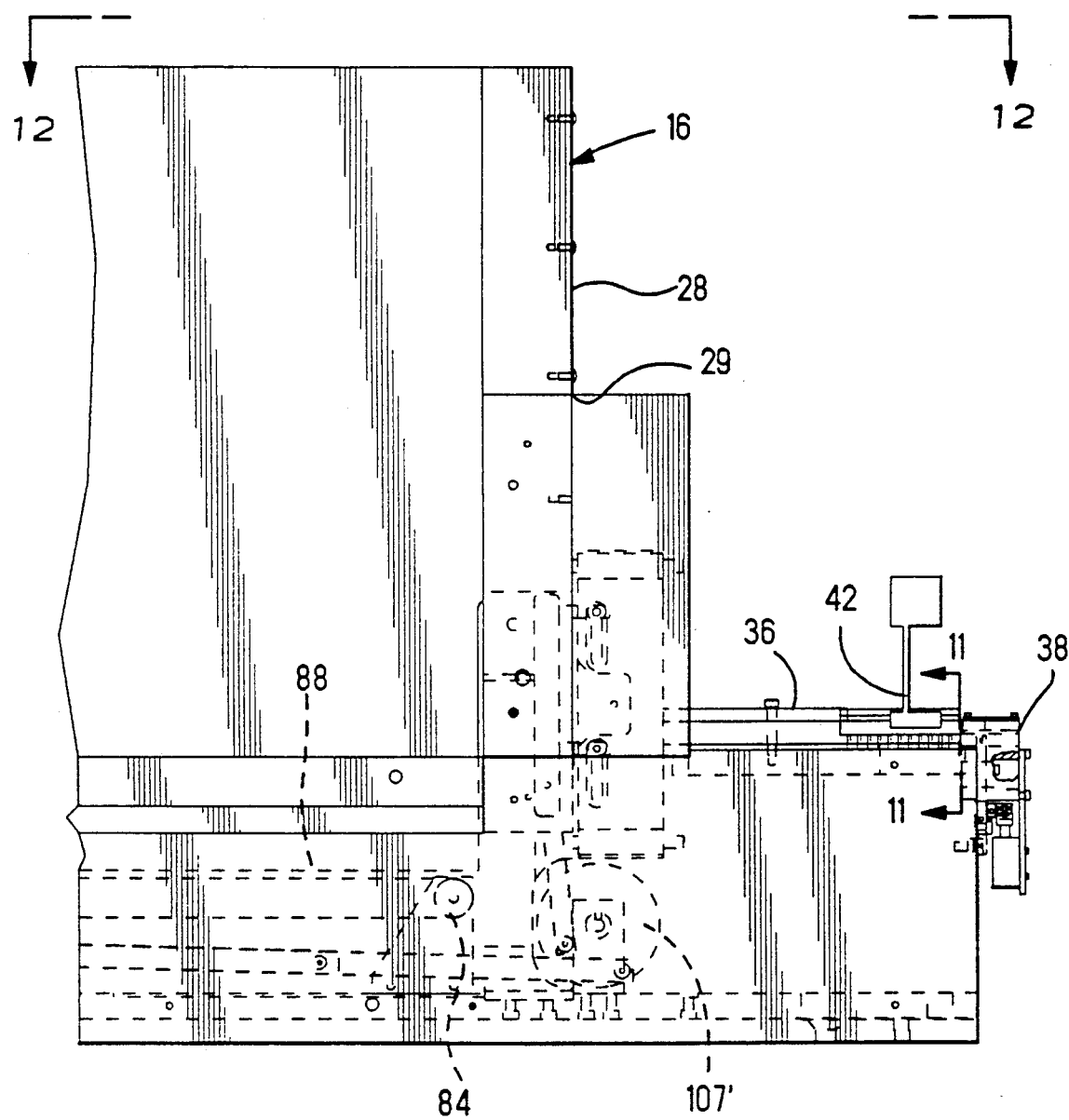
FIG. 10 is a side view of the right-hand side of the apparatus showing portions of a robot arm.
Figure 11:
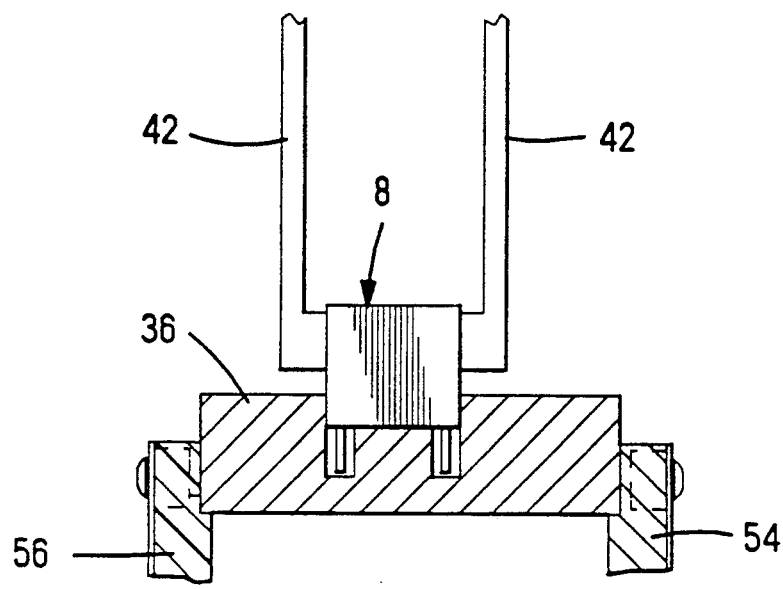

FIGS. 11 and 12 are views looking in the directions of the arrows 11—11 and 12—12 of FIG. 10.

Figure 13:
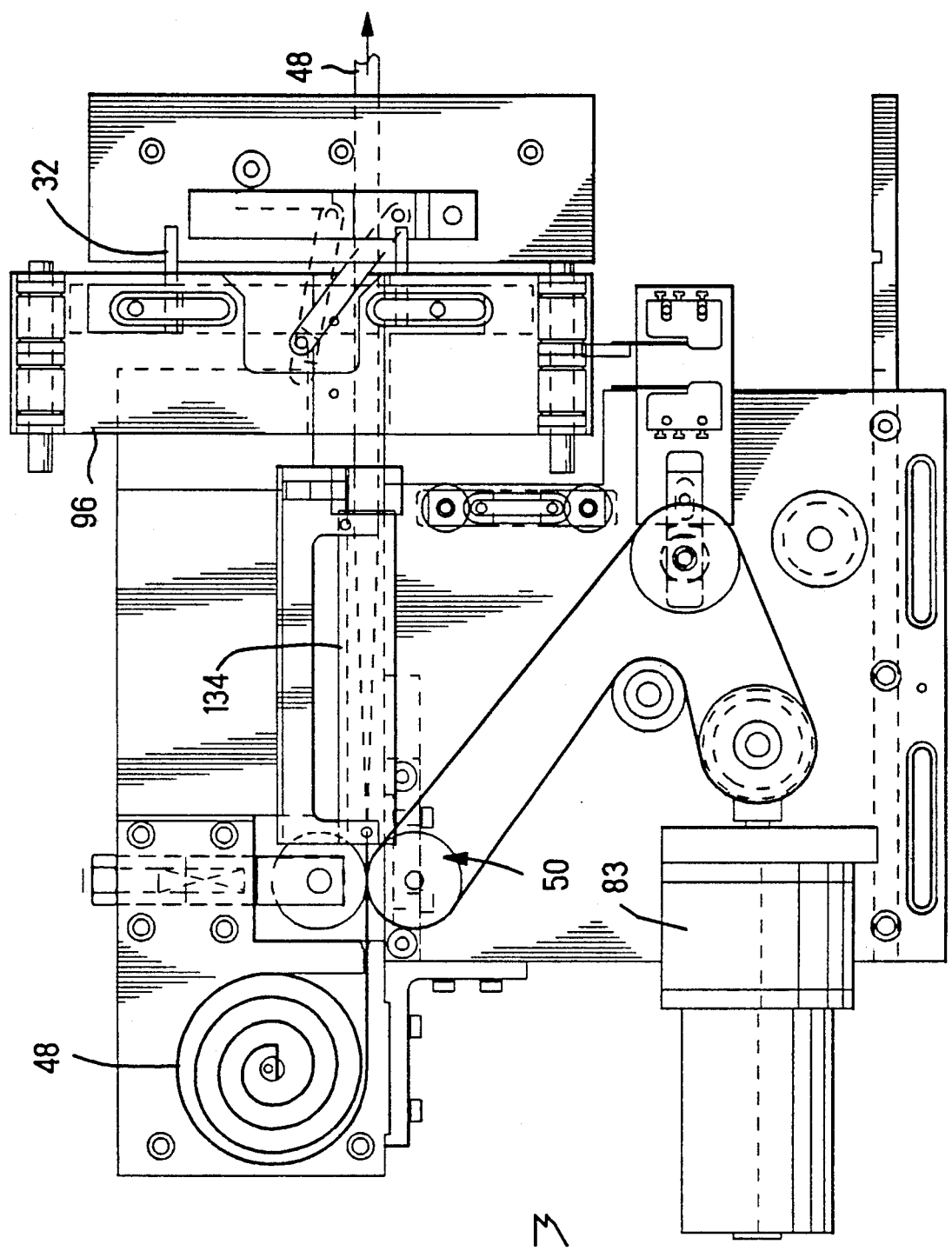

FIG. 13 is a side view showing a tape twisting guide.

Figure 14:
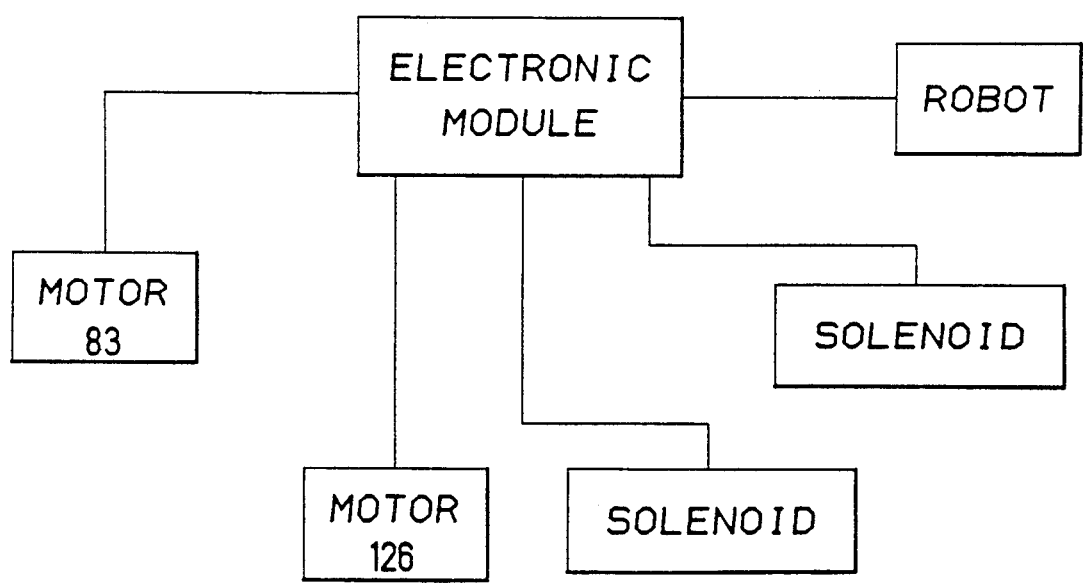

FIG. 14 is a block diagram of a control system for the apparatus.

THE DISCLOSED EMBODIMENT

FIG. 1 shows a typical tube magazine 2 having first and second ends 4, 4' and containing a plurality of electronic components 8. The components may be of any desired type, for example, integrated circuit devices, connectors, socket members, etc. The component 8 which is disclosed has an elongated prismatic body and has leads 10 extending from its lower surface and arranged in two spaced-apart rows. The components are loaded into the magazine 2 at the time of manufacture and the open ends of the tube are temporarily plugged for shipment. When the components are placed in service, the individual components are fed from the tubes to a pickup station in a feeding and dispensing apparatus 12 as described below.

The apparatus 12, FIGS. 2A–12, is supported on a horizontal base plate 14 which in turn would be supported on a support surface. The apparatus 12 would, in use, be part of an assembly apparatus including a robot having fingers 42 as shown in FIG. 11, for picking up a component at a pick-up station shown at the right in FIG. 2B.

The apparatus comprises first and second column assemblies 16, 16' which are spaced-apart by a distance substantially equal to the length of the tube magazines 2 which it is intended to receive. The column assemblies 16, 16' are similar to each other in most respects so that a description of one will suffice for both, and the same reference numerals, differentiated by prime marks, will be used to identify corresponding structural elements in the two column assemblies. In the description which follows, only the first column assembly 16 is described in detail, and features of the second column assembly 16' are noted where appropriate.

The column assembly 16 comprises two individual spaced-apart column members 18, 20, FIG. 4, which are secured to an adaptor or foot plate 22 which in turn is secured to the base plate 14. The column members 18, 20 have opposed internal surfaces 24, 26 which are spaced-apart by a distance slightly greater than the thickness of a tube magazine so that the tubes will be supported between the first and second column assemblies and will be confined by the surfaces 24, 26. A cover plate 28 is fastened to the leftwardly facing sides of the column members to confine the tube magazines against axial movement. The lower edge 29 of the cover plate is spaced from the plate 22 for the reason that clearance must be provided for the pusher 44 and pins 30, 32 which move into the space between the surfaces 24, 26. Panels 17 extend between columns 18, 18' and between columns 20, 20'.

Figure 5:
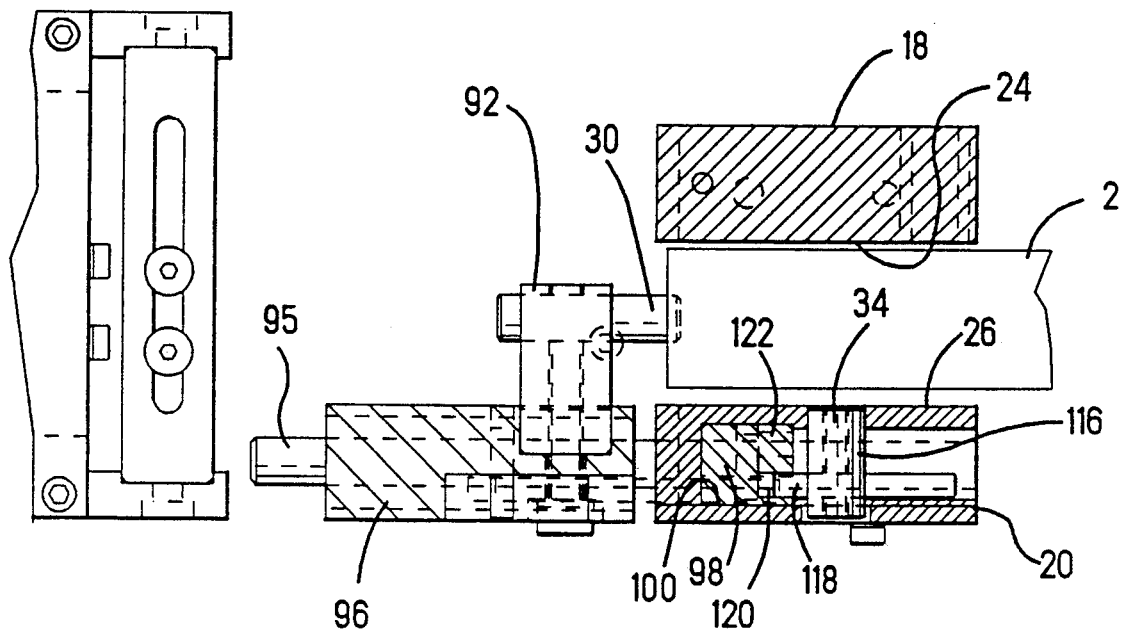
FIG. 5 is an enlarged view showing the left-hand portion of FIG. 4.
Figure 6:
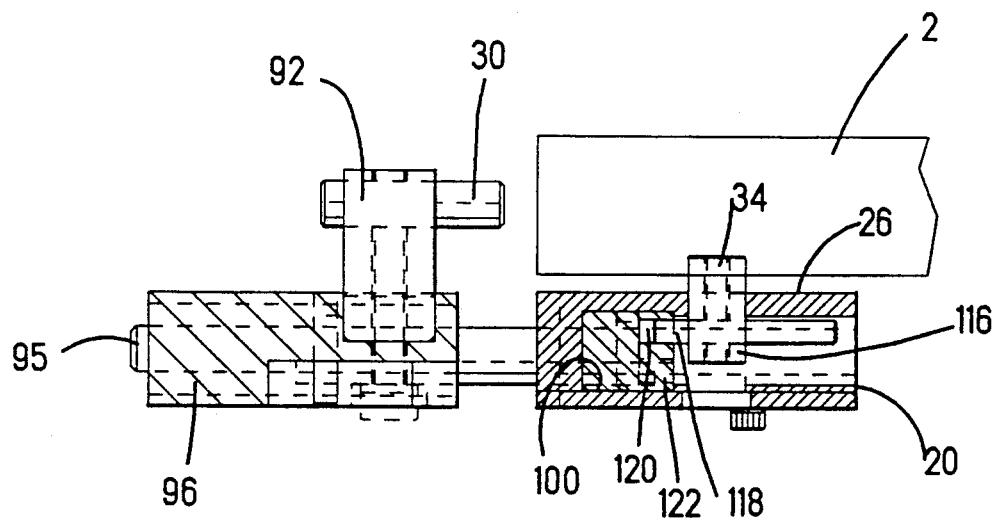
FIG. 6 is a view similar to FIG. 5 showing the positions of the parts during ejection of an empty tube.

The lowermost tube 2 shown in FIGS. 2A and 2B is supported on pins 30, 30' which are part of the two column assemblies and which extend beneath the lowermost tube. Additionally, upper supporting pins 32, 32' are provided which support an inventory of filled tube magazines 2 which are dispensed, one at a time, to the lowermost pins 30, 30' when the lowermost tube is empty. An intermediate set of pins 34, 34', shown in FIGS. 4-6, are also provided which move between retracted and extended positions (FIGS. 5 and 6) when an empty tube is being removed as will be described below.

A guide track assembly 36 extends rightwardly from the column assembly 16' and is in alignment with the tube 2 which is in feeding position and is supported on pins 30, 30' at a feeding station. In the disclosed embodiment, this guide track is dimensioned such that it can be straddled by the two rows of leads 10 which extend from the component 8. At the end of the guide track, there is provided a fixed stop block 38 which contains a sensor and which contains a leftwardly facing stop surface 40. This stop surface defines the pickup station in that the component located against surface 40 is precisely located so that it can be picked up by the arms 42 of a robot and transferred from the pickup station to a further work station in the machine, see FIGS. 10 and 11.

The individual components are fed from the tube magazine, which is in feeding position and supported on the pins 30, 30', by a rigid pusher 44 that has a cross-section which conforms to the cross-section of the interior of the tube magazine. The trailing end of the pusher 44 is connected to the leading end portion 46 of a flexible tape 48. The tape extends from the pusher through a feed roll assembly 50 and into a cylindrical tape housing 52 which is adjacent to the first column assembly.

The tape and tape housing are of the type used for steel measuring tapes and need not be described in detail. The tape is coiled within the housing and a spring is provided in the housing to retract the tape after it has been pulled from the housing. The tape may be of a medium carbon steel such as AISI 1095 which is formed with a camber. Such carbon steel tapes are conventionally fully hardened to a Rockwell hardness of C62 and then tempered until the Rockwell harness is in the range of about C48-52. Tapes suitable for the practice of the invention are commercially available, for example, in widths of 0.25 inches (6.3 mm) and 0.50 inches (12.7 mm). Under some circumstances, as where the components and tube magazines are relatively small, it is necessary to use a 0.25 inch tape and such tapes are entirely satisfactory for pushing small components which have a relatively low mass. Where larger components are involved, the tube will necessarily have greater inside dimensions and a 0.5 inch width tape is used.

The feed roll assembly 50 and the tape housing 52 (FIG. 8) are contained and supported between spaced-apart side plates 54, 56 which are secured to, and which extend vertically from the foot plate 22 which is supported on base plate 14. The feed roll assembly comprises an upper idler feed roll 58 which is rotatably supported on a shaft 60 in a frame or housing 62. A spring is provided in the housing 62 to adjust the force exerted by the upper feed roll on the lower feed roll 66. The lower roll 66 is keyed or otherwise secured to a shaft 68 which has a pulley 70 on its end. A drive belt 72 extends over pulley 70, around an idler pulley 74, around a pulley 76 on a shaft 78, around a pulley 80 on a shaft 82 and then back to the pulley 70. The idler pulley is adjustably supported as shown at 75 to permit adjustment of the tension in the belt. Shaft 82 is the power shaft and is coupled by a right angle drive to a motor 83 which is controlled by the control system of the machine. Motor 83 is reversible so that rotation in one direction causes the feed rolls to withdraw the tape 48 from its housing 52 and movement of the pusher 44 through a tube 2 which is in feeding position and rotation in the opposite direction retracts the tape and pusher.

Figure 7:
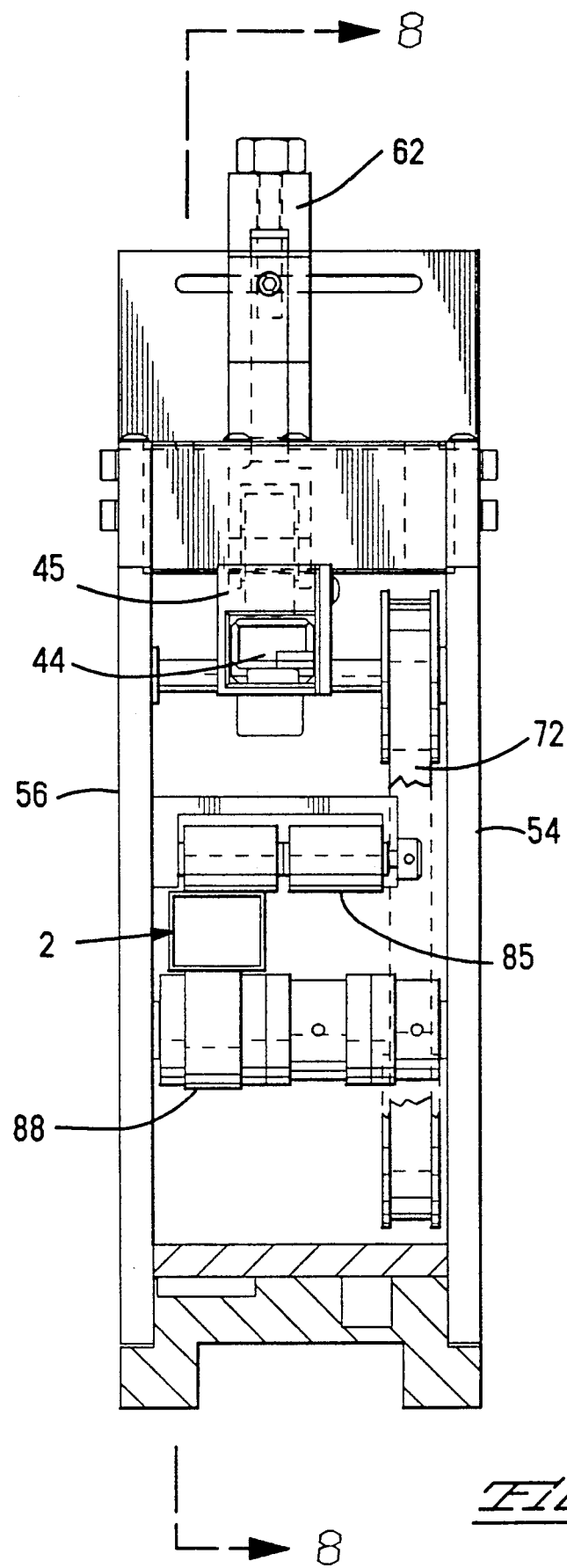
FIG. 7 is a view looking in the direction of the arrows 7—7 of FIG. 3A.
Figure 9:
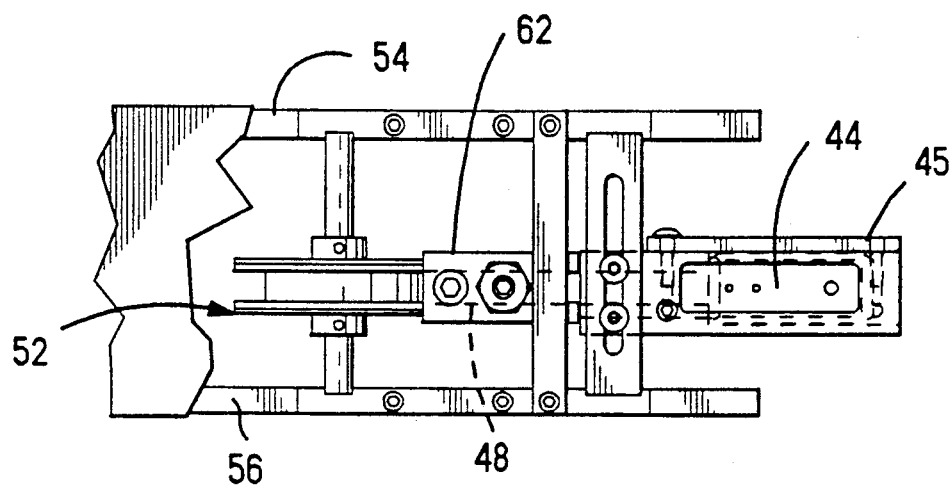
FIG. 9 is a view looking in the direction of the arrows 9—9 of FIG. 8.
Figure 8:
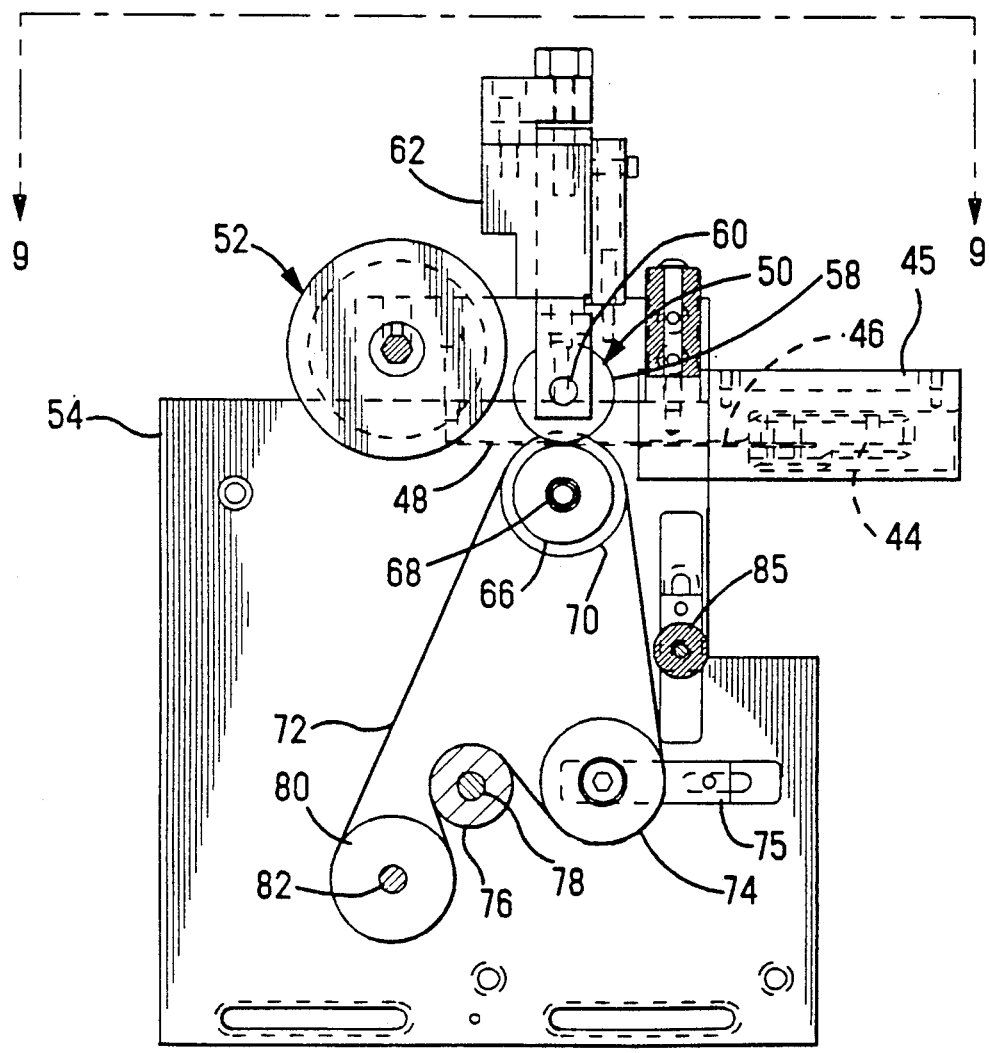
FIG. 8 is a view looking in the direction of the arrows 8—8 of FIG. 7.

When the apparatus is in service and is being operated continuously, the tubes will be emptied in a relatively short time, and it is desirable to provide a system for removing empty tubes from the machine. The tube ejecting system comprises a conveyor belt 88 which extends around rolls 84, 84' that are adjacent to the first and second column assemblies. The roll 84 is secured to shaft 78 so that when the tape feed rolls 50 are rotated in the direction which feeds tape from the tape housing and through the tube supported on the pins 30, the roll 84 is rotated in a direction which causes the upper course of the conveyor belt to move leftwardly thereby moving a previously ejected empty tube leftwardly from the apparatus. The tube 2 which is being removed by the conveyor is guided by rollers 85, FIG. 7, which are journaled on a shaft supported on one of the side plates. As best shown in FIG. 7, clearance is provided above the belt 88 for the tube so that it can be ejected axially by the conveyor.

The pin 30, which supports, in cooperation with pin 30', the tube in a feeding position, extends from a block 92 which in turn is adjustably secured in a recess in a horizontally reciprocable block 96. The block 92 can be vertically adjusted within the recess and locked in position by a suitable set screw 93. Adjustment of the position of pin 30 is required for different sizes or types of tube magazines. The upper pin 32 is similarly adjustably secured on a block 92 in a recess in block 96.

The block 96 is slidably supported on pins 95 which extend from column 20 and is horizontally movable a short distance between the two positions shown in FIGS. 2A and 3A. In the position of FIG. 2A, block 96 is adjacent to column assembly 16 and the pins 30, 32 project into the space between the columns 18, 20 32' thereby to support tube magazines. The upper pins 32, support an inventory of filled tubes while the lower pins 30, 30' support the tube which is in its feeding position. The horizontal movement of the block 96 is described below.

A slide block 98 (FIG. 5) is provided in a suitable recess 100 in the column 20 and is pivoted at its lower end 102 to a link 104 which in turn extends to a pivotal connection 106 on a disk 107. The disk is oscillated through an angle of about 30 degrees to cause reciprocating vertical movement of the slide block 98. The block 96 is connected by a link 110 to the vertically reciprocable block 98, link 110 being pivoted at 112 and 108 to the blocks 96 and 98, respectively. As shown by FIGS. 2A and 3A, upward movement of the block 98 causes the carrier block 96 to move horizontally away from the column 20 to the position of FIG. 3A and downward movement of block 98 causes the block 96 to move towards the column 20 so that the pins 30, 32 move from, and then back into, their supporting positions.

The intermediate pin 34 extends horizontally into the space between the opposed surfaces 24, 26 of the column members 18, 20 when the parts are in the positions of FIG. 6. When it is in this extended position, it supports a lowermost tube magazine, and when withdrawn to its retracted position, FIG. 5, it releases the tube magazine which then falls down onto the pins 30, 30'. The movement of the intermediate support pin 34 is achieved by a camming plate 122 which is mounted on slide block 98. The camming plate has a cam track 120 therein which receives a cam follower 118 extending from a block 116 which is integral with pin 34. The block 116 is movable horizontally along with the pin 34, and such movement is achieved by the cam follower 118 and cam track 120.

The disk 107 is coupled to a disk 107' by a connecting rod 124 and the disk 107' is oscillated by a motor 126 which is under the control of the control system, the disk 107' being coupled to the motor by a suitable right angle drive.

The control system for the apparatus (FIG. 14) may be a conventional electronic control system composed of a suitable electronic module or microprocessor having conductors extending to the robot, suitable solenoids which control the clamping devices, and to the two motors described above.

The operation of the apparatus is as follows.

An inventory of filled magazines is placed in the apparatus above the pins 32 with the lowermost magazine supported by the pins 32 and the others stacked on top of the lowermost tube magazine of the inventory. At the beginning of an operating cycle, a filled magazine will be supported on the pins 30, 30' and a previously ejected magazine will rest on the conveyor belt. When operation begins, the pusher 44 is moved by the tape 48 into the tube 2 and feeds the leading component in the tube against the stop at the pickup station. The presence of the leading component is sensed, and the robot arm grasps the leading component. A compressive force is retained on the stack of components in the tube by the pusher until the robot arm grips the leading component, at which time a signal is sent which causes the pusher to retract a short distance so that the leading component is unclamped. In other words, the leading component is maintained in a clamped position and therefore is precisely positioned until it is gripped by the robot arm. After the robot arm removes the leading component from the pickup station, the control system operates to rotate the feed rolls and move the next adjacent component to the pickup station. This process continues until the tube supported on the pins 30, 30' is empty, at which time the tape is retracted and the pusher 44 is pulled leftwardly from between the column assemblies and into a pusher housing 45 (FIG. 4). When this motion is sensed by the control system, the disks 107, 107' are rotated in a clockwise direction through an angle of about 30 degrees thereby to withdraw the pins 30, 32 from their supporting positions and move the pins 34, 34' into their supporting positions. A filled tube then drops onto the pins 34, 34' and the disks 107, 107' are rotated in a counter-clockwise direction so that the pins 32, 32' are moved into their supporting positions. The withdrawal of the pins 34, 34' permits the tube magazine which was previously supported thereon to fall by gravity onto the pins 30, 30' in preparation for the next operating cycle.

FIG. 13 shows a tape twisting guide 134 which twists the tape through an angle of 90 degrees and is required under some circumstances. The guide is located adjacent to the feed rolls and adjacent to the pusher housing. The twisting guide is required when the components, and the magazine tubes are relatively narrow in their horizontal dimension and are relatively tall in a vertical sense. If the tape has a width which is greater than the width of the interior of the tube but less than the vertical dimension thereof, the tape must be twisted so that it will be in a vertical orientation when it moves through the tube. The twisting guide 134 is located between the feed roll assembly 50 and the block 96. In order to provide space for the twisting guide, the feed rolls and the tape housing 52 are moved leftwardly from their positions of FIG. 2A.

Several advantages are achieved by the practice of the invention. The tape and pusher provide an extremely simple and effective system for feeding the components from the tube magazine to the pickup station and the need for two feeding systems as in some prior feeders (a first feeding system for feeding components from the tube to the guide track and a second feeding system for feeding the components along the guide track) is avoided. A further advantage is that a highly effective system is provided for ejecting empty tubes. The empty tubes are moved axially from the apparatus, rather than laterally, a feature which permits the apparatus to be of minimum width. Feeding apparatus of the type described herein are usually mounted side-by-side with identical feeding devices on an assembly machine for assembling circuit boards or the like. It is important that the widths of the feeders be kept to a minimum in order to permit mounting the feeders in the limited space available on the assembly machine.

We claim:

1. Apparatus for successively dispensing tube magazines from an inventory of the tube magazines to a feeding station wherein articles carried by the tube magazines are fed therefrom to an article pickup station, each of the tube magazines comprising an elongated tube having an axis extending in a direction of elongation between opposite ends, each of the tubes having a width, the apparatus comprising:

means for confining the inventory of tubes above the feeding station such that one of the tubes in the inventory is a lowermost tube;

first tube supporting means movable between an extended position for supporting a dispensed tube at the feeding station in a substantially horizontal feeding position, and a retracted position wherein the dispensed tube becomes unsupported by the first supporting means;

second tube supporting means above the first tube supporting means and movable between an extended position for supporting the lowermost tube in the inventory of tubes in a substantially horizontal position, and a retracted position wherein the lowermost tube becomes unsupported by the second supporting means;

intermediate tube supporting means between the first and second supporting means, the intermediate supporting means being movable between an extended position for supporting the lowermost tube in a substantially horizontal position when the second supporting means is retracted, and a retracted position wherein the lowermost tube becomes unsupported by the intermediate supporting means, the intermediate supporting means being spaced from the second supporting means such that when the lowermost tube is supported by the intermediate supporting means a next lowermost tube is disposed for capture and resulting support by the second supporting means; and, control means for normally maintaining the first and second supporting means in their extended positions and normally maintaining the intermediate supporting means in its retracted position during feeding of the articles from the dispensed tube to the article pickup station, for moving the first and second supporting means to the retracted positions and moving the intermediate supporting means to its extended position after the dispensed tube has been emptied, wherein the empty tube in the feeding station falls by gravity to an empty tube receiving means and the lowermost tube in the inventory falls by gravity to the intermediate tube supporting means and is supported thereby with others of the inventory falling to rest on the now-supported lowermost tube, and for thereafter moving the first and second supporting means to their extended positions and moving the intermediate supporting means to its retracted position, wherein the lowermost tube falls by gravity for dispense to the feeding station and the next lowermost tube is supported by the second supporting means.

2. The apparatus according to claim 1, further comprising an empty tube transporting means for moving the empty tube in the receiving means away from the apparatus.

3. The apparatus according to claim 2, wherein the empty tube transporting means is aligned for moving the empty tube axially from the apparatus.

4. The apparatus according to claim 2, wherein the empty tube receiving means and the empty tube transporting means comprises an endless belt conveyor.

5. The apparatus according to claim 4, wherein the endless belt conveyor has an upper course which extends parallel to the direction of elongation of the tube in the feeding station for moving the empty tube axially from the apparatus.

6. The apparatus according to claim 1, wherein the means for confining comprises a pair of spaced apart column assemblies disposed for confining the tubes proximate their opposite ends.

7. The apparatus according to claim 6, wherein each of the column assemblies defines a pair of opposed surfaces which are spaced apart by a distance substantially equal to the width of one of the tubes, whereby the tubes in the inventory are confined between the opposed surfaces such that the tubes are stacked parallel to each other in an upwardly extending array.

8. The apparatus according to claim 7, wherein the first and second tube supporting means comprise pins coupled for synchronous movement between the extended and retracted positions, the pins being configured for engagement beneath surfaces of the tubes when the pins are in the extended position.

9. The apparatus according to claim 8, wherein the pins of the second supporting means are vertically adjustable in position.

10. The apparatus according to claim 8, wherein the intermediate tube supporting means comprises intermediate pins movably attached to the column assemblies, and cam linkage connected for synchronously moving the intermediate pins between their extended and retracted positions in a sequence opposite to the movement of the pins of the first and second supporting means.

11. The apparatus according to claim 8, wherein the pins are attached to mounting blocks which are opposed to the opposite ends of the tubes, the mounting block being movable for moving the pins between the extended and retracted positions, the pins extending parallel to the axes of the tubes when the pins are in the extended positions.

12. The apparatus according to claim 11, wherein the pins of the second supporting means engage within as interior region of the lowermost tube when said pins are in the extended position.

13. The apparatus according to claim 11, wherein the pins of the first and second supporting means are vertically adjustable in position.

* * * * *